US012559655B2

(12) United States Patent
Sawada et al.

(10) Patent No.: US 12,559,655 B2
(45) Date of Patent: Feb. 24, 2026

(54) POLYSILOXANE-CONTAINING TEMPORARY ADHESIVE COMPRISING HEAT-RESISTANT POLYMERIZATION INHIBITOR

(71) Applicant: NISSAN CHEMICAL CORPORATION, Tokyo (JP)

(72) Inventors: Kazuhiro Sawada, Toyama (JP); Shunsuke Moriya, Toyama (JP); Tetsuya Shinjo, Toyama (JP); Hiroshi Ogino, Toyama (JP); Takahisa Okuno, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 1052 days.

(21) Appl. No.: 17/052,223

(22) PCT Filed: Apr. 23, 2019

(86) PCT No.: PCT/JP2019/017197

§ 371 (c)(1),
(2) Date: Nov. 2, 2020

(87) PCT Pub. No.: WO2019/212008

PCT Pub. Date: Nov. 7, 2019

(65) Prior Publication Data

US 2021/0130666 A1 May 6, 2021

(30) Foreign Application Priority Data

May 1, 2018 (JP) ................................ 2018-088393

(51) Int. Cl.

| | |
|---|---|
| ***C09J 5/04*** | (2006.01) |
| ***B32B 7/06*** | (2019.01) |
| ***C09J 11/06*** | (2006.01) |
| ***C09J 183/04*** | (2006.01) |
| ***H10P 52/00*** | (2026.01) |
| ***H10P 72/70*** | (2026.01) |

(52) U.S. Cl.

CPC ............... *C09J 183/04* (2013.01); *B32B 7/06* (2013.01); *C09J 5/04* (2013.01); *C09J 11/06* (2013.01); *H10P 52/00* (2026.01); *H10P 72/7402* (2026.01); *B32B 2457/14* (2013.01); *C09J 2483/00* (2013.01)

(58) Field of Classification Search

None

See application file for complete search history.

(56) References Cited

U.S. PATENT DOCUMENTS

| | | | | |
|---|---|---|---|---|
| 1,776,837 A * | 9/1930 | Maccarthy | ............ H04M 1/667 379/445 |
| 5,629,387 A | 5/1997 | Frances et al. | |
| 11,183,415 B2 * | 11/2021 | Ogino | ........................ C09J 5/06 |
| 11,776,837 B2 * | 10/2023 | Moriya | ............... H01L 21/6836 428/447 |
| 2008/0014532 A1 * | 1/2008 | Kessel | ................ H01L 21/6835 430/311 |
| 2009/0176349 A1 | 7/2009 | Jakob et al. | |
| 2010/0043608 A1 | 2/2010 | Jakob | |
| 2011/0272092 A1 | 11/2011 | Richter | |
| 2012/0028438 A1 | 2/2012 | Richter | |
| 2012/0276717 A1 | 11/2012 | Furuya et al. | |
| 2013/0023109 A1 | 1/2013 | Harkness | |

(Continued)

FOREIGN PATENT DOCUMENTS

| | | |
|---|---|---|
| EP | 3 907 074 A1 | 11/2021 |
| JP | H06-329917 A | 11/1994 |

(Continued)

OTHER PUBLICATIONS

May 31, 2023 Office Action issued in Japanese Patent Application No. 2020-517050.

Jan. 16, 2023 Office Action issued in Taiwanese Patent Application No. 108114686.

Sep. 19, 2023 Office Action issued in Taiwanese Patent Application No. 108114686.

Oct. 20, 2023 Office Action issued in Korean Patent Application No. 10-2020-7031002.

Dec. 13, 2021 extended Search Report issued in European Patent Application No. 19796150.1.

Jun. 11, 2019 International Search Report issued in International Patent Application No. PCT/JP2019/017197.

Jun. 11, 2019 Written Opinion issued in International Patent Application No. PCT/JP2019/017197.

(Continued)

*Primary Examiner* — Anish P Desai

(74) *Attorney, Agent, or Firm* — Oliff PLC

(57) ABSTRACT

A temporary adhesive without the formation of voids between a support and a wafer. A temporary adhesive for separatably attaching a support to a circuit side of a wafer to process a rear surface of the wafer, the temporary adhesive including a component (A) that is cured by a hydrosilylation reaction; a polymerization inhibitor (B) having a 5% mass decrease temperature of 80° C. or higher as measured using a Tg-DTA; and a solvent (C). The component (A) may include a polysiloxane (A1) including a polyorganosiloxane (a1) containing a $C_{1-10}$ alkyl group and a $C_{2-10}$ alkenyl group, and a polyorganosiloxane (a2) containing a $C_{1-10}$ alkyl group and a hydrogen atom; and a platinum group metal-based catalyst (A2). The polymerization inhibitor (B) may be a compound of formula (1):

Formula (1)

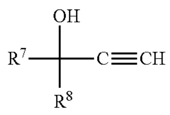

(wherein $R^7$ and $R^8$ are each a $C_{6-40}$ aryl group, or a combination of a $C_{1-10}$ alkyl group and a $C_{6-40}$ aryl group).

17 Claims, No Drawings

(56) References Cited

U.S. PATENT DOCUMENTS

| | | | | |
|---|---|---|---|---|
| 2014/0213039 | A1 | 7/2014 | Lee et al. | |
| 2017/0200628 | A1 | 7/2017 | Kamibayashi et al. | |
| 2019/0099517 | A1* | 4/2019 | Moine | A61L 15/26 |
| 2019/0164802 | A1 | 5/2019 | Ogino et al. | |
| 2020/0109325 | A1* | 4/2020 | Sawada | C09J 183/06 |

FOREIGN PATENT DOCUMENTS

| | | | | |
|---|---|---|---|---|
| JP | 2006-508540 | A | 3/2006 | |
| JP | 2009-528688 | A | 8/2009 | |
| JP | 2012-510715 | A | 5/2012 | |
| JP | 2012-513684 | A | 6/2012 | |
| JP | 2012-169573 | A | 9/2012 | |
| JP | 2012-229333 | A | 11/2012 | |
| JP | 2013-520009 | A | 5/2013 | |
| JP | 2013-179135 | A | 9/2013 | |
| JP | 2013-232459 | A | 11/2013 | |
| JP | 2014-146793 | A | 8/2014 | |
| TW | 201518416 | A | 5/2015 | |
| WO | 2006/093639 | A1 | 9/2006 | |
| WO | 2016/181879 | A1 | 11/2016 | |
| WO | WO-2017158250 | A1 * | 9/2017 | A61L 15/26 |
| WO | 2017/221772 | A1 | 12/2017 | |

OTHER PUBLICATIONS

Aug. 1, 2024 Office Action issued in Korean Patent Application No. 10-2020-7031002.

Jun. 20, 2025 Office Action issued in Chinese Patent Application No. 201980029351.6.

Dec. 27, 2024 Office Action issued in Chinese Patent Application No. 201980029351.6.

Mar. 18, 2025 Office Action issued in European Patent Application No. 19796150.1.

* cited by examiner

POLYSILOXANE-CONTAINING TEMPORARY ADHESIVE COMPRISING HEAT-RESISTANT POLYMERIZATION INHIBITOR

TECHNICAL FIELD

The present invention relates to a temporary adhesive for fixing a wafer on a support when a rear surface of the wafer is polished, and a layered body using the same.

BACKGROUND ART

For conventional semiconductor wafers that are two-dimensionally integrated in a plane direction, a semiconductor integration technology of further integrating (layering) planes of wafers in a three-dimensional direction for further integration has been required. The layering in the three-dimensional direction is a technology in which wafers are integrated into a multilayer so as to be connected with a through silicon via (TSV). When semiconductor wafers are integrated into a multilayer, each of the semiconductor wafers to be integrated is thinned by polishing a surface (i.e., a rear surface) opposite to a surface on which a circuit is formed, and the thinned semiconductor wafers are layered.

A semiconductor wafer (herein, also simply referred to as a wafer) before thinning is attached to a support to be polished with a polisher. In this case, the attachment is referred to as temporary attachment, since the semiconductor wafer needs to be easily separated after polishing. The temporary attachment requires easy detachment from the support. When a large force is applied for the detachment, a thinned semiconductor wafer may be broken or deformed, and in order to avoid this, the thinned semiconductor wafer is easily detached. However, it is also undesirable that the semiconductor wafer be detached or shifted by a polishing stress while the rear surface of the semiconductor wafer is being polished. Therefore, the performance required for the temporary attachment is the resistance to stress during polishing and easy detachment after polishing.

For example, performances such as high stress in a plane direction during polishing (high adhesion force) and low stress in a longitudinal direction during detachment (low adhesion force) are required.

As a process of such attachment, a method in which an adhesive layer and a separation layer are provided, and the separation layer is formed by plasma polymerization of dimethylsiloxane, and mechanically separated after polishing (see Patent Documents 1 and 2), a method in which a semiconductor wafer is attached to a supporting substrate with an adhesive composition, a rear surface of the semiconductor wafer is polished, and the adhesive is then removed with an etching solution (see Patent Document 3), and a wafer processed body including, as an adhesive layer for attachment of a semiconductor wafer to a support, a combination of a polymerized layer obtained by polymerizing an alkenyl group-containing organopolysiloxane and a hydrosilyl group-containing organopolysiloxane using a platinum catalyst with a polymerized layer composed of a thermosetting polysiloxane (see Patent Documents 3, 4, 5, and 6), are disclosed.

A long-chain α-acetylenic alcohol as a hydrosilylation inhibitor and a curable silicone composition are disclosed (see Patent Document 7).

PRIOR ART DOCUMENTS

Patent Documents

Patent Document 1: Japanese Unexamined Patent Application Publication (Translation of PCT Application) No. 2012-510715 (JP 2012-510715 A)

Patent Document 2: Japanese Unexamined Patent Application Publication (Translation of PCT Application) No. 2012-513684 (JP 2012-513684 A)

Patent Document 3: Japanese Unexamined Patent Application Publication No. 2013-179135 (JP 2013-179135 A)

Patent Document 4: Japanese Unexamined Patent Application Publication No. 2013-232459 (JP 2013-232459 A)

Patent Document 5: Japanese Unexamined Patent Application Publication No. 2006-508540 (JP 2006-508540 A)

Patent Document 6: Japanese Unexamined Patent Application Publication No. 2009-528688 (JP 2009-528688 A)

Patent Document 7: Japanese Unexamined Patent Application Publication No. H6-329917 (JP H6-329917 A)

SUMMARY OF THE INVENTION

Problems to be Solved by the Invention

The present invention provides a temporary adhesive that inhibits curing from proceeding before attachment, has excellent spin coating properties on a circuit side of a wafer or a support, has excellent heat resistance when the circuit side of the wafer or the support is attached to an adhesive layer or when a rear surface of the wafer is processed, and is capable of easily separating the circuit side of the wafer from the support after polishing the rear surface of the wafer, and readily removing the adhesive attached to the wafer or the support after the separation; a layered body using the temporary adhesive; and a processing method using the layered body. The present invention particularly provides a temporary adhesive capable of achieving temporary attachment without the formation of voids between the support and the wafer.

Means for Solving the Problems

A first aspect of the present invention is a temporary adhesive for separatably attaching a support to a circuit side of a wafer to process a rear surface of the wafer, the temporary adhesive comprising a component (A) that is cured by a hydrosilylation reaction; a polymerization inhibitor (B) having a 5% mass decrease temperature of 80° C. or higher as measured using a Tg-DTA; and a solvent (C).

A second aspect of the present invention is the temporary adhesive according to the first aspect, wherein the component (A) comprises a polysiloxane (A1) including a polyorganosiloxane (a1) containing a polysiloxane selected from the group consisting of a siloxane unit (Q unit) of $SiO_2$, a siloxane unit (M unit) of $R^1R^2R^3SiO_{1/2}$, a siloxane unit (D unit) of $R^4R^5SiO_{2/2}$, and a siloxane unit (T unit) of $R^6SiO_{3/2}$ (with the proviso that $R^1$ to $R^6$ are each bonded to a silicon atom through an Si—C bond or an Si—H bond), wherein monovalent chemical groups of $R^1$ to $R^6$ each contain a $C_{1-10}$ alkyl group and a $C_{2-10}$ alkenyl group, and a polyorganosiloxane (a2) containing the polysiloxane, wherein monovalent chemical groups of $R^1$ to $R^6$ each contain a $C_{1-10}$ alkyl group and a hydrogen atom; and a platinum group metal-based catalyst (A2).

A third aspect of the present invention is the temporary adhesive according to the first or second aspect, wherein the polymerization inhibitor (B) is a compound of formula (1):

Formula (1)

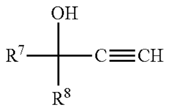

(wherein $R^7$ and $R^8$ are each a $C_{6-40}$ aryl group, or a combination of a $C_{1-10}$ alkyl group and a $C_{6-40}$ aryl group, and $R^7$ and $R^8$ may together form a ring).

A fourth aspect of the present invention is the temporary adhesive according to the first or second aspect, wherein the polymerization inhibitor (B) is 1-phenyl-2-propyn-1-ol, 2-phenyl-3-butyn-2-ol, 1,1-diphenyl-2-propyn-1-ol, or 9-ethynyl-9-fluorenol.

A fifth aspect of the present invention is the temporary adhesive according to any one of the first to fourth aspects, wherein the temporary adhesive comprises a polydimethylsiloxane, an epoxy group-containing polydimethylsiloxane, a phenyl group-containing polydimethylsiloxane, or a mixture thereof as a separating component (D).

A sixth aspect of the present invention is a layered body for processing a rear surface of a wafer, comprising a temporary adhesive layer formed using the temporary adhesive according to any one of the first to fifth aspects to separatably attach a support to a circuit side of the wafer.

A seventh aspect of the present invention is a layered body for processing a rear surface of a wafer, comprising a temporary adhesive layer that separatably attaches a support to a circuit side of the wafer, and a separating agent layer, wherein the temporary adhesive layer is formed using the temporary adhesive according to any one of the first to fifth aspects, and the separating agent layer is formed of a polydimethylsiloxane, an epoxy group-containing polydimethylsiloxane, a phenyl group-containing polydimethylsiloxane, or a mixture thereof.

An eighth aspect of the present invention is a method for attaching a layered body, comprising applying the temporary adhesive according to any one of the first to fifth aspects onto a first body and removing a solvent by heating to form a temporary adhesive layer, attaching a second body to the temporary adhesive layer, and heating the resulting product from a side of the first body.

A ninth aspect of the present invention is a method for attaching a layered body, comprising applying the temporary adhesive according to any one of the first to fifth aspects onto a first body and removing a solvent by heating to form a temporary adhesive layer, applying a separating agent including a polydimethylsiloxane, an epoxy group-containing polydimethylsiloxane, a phenyl group-containing polydimethylsiloxane, or a mixture thereof onto a second body and heating the separating agent to form a separating agent layer, attaching the first body to the second body such that the temporary adhesive layer faces the separating agent layer, and heating the resulting product from a side of the first body.

A tenth aspect of the present invention is the method for attaching a layered body according to the eighth or ninth aspect, wherein the first body is a support, the second body is a wafer, and a circuit side of the wafer faces a surface of the first body.

An eleventh aspect of the present invention is the method for attaching a layered body according to the eighth or ninth aspect, wherein the first body is a wafer, the second body is a support, and a circuit side of the wafer faces a surface of the second body.

A twelfth aspect of the present invention is a separation method comprising applying the temporary adhesive according to any one of the first to fifth aspects onto a first body to form a temporary adhesive layer, attaching a second body to the temporary adhesive layer, heating the resulting product from a side of the first body to cure the temporary adhesive layer to accomplish a layered body, processing the layered body, and carrying out separation between the bodies and the temporary adhesive layer.

A thirteenth aspect of the present invention is a separation method comprising applying the temporary adhesive according to any one of the first to fifth aspects onto a first body to form a temporary adhesive layer, applying a separating agent including a polydimethylsiloxane, an epoxy group-containing polydimethylsiloxane, a phenyl group-containing polydimethylsiloxane, or a mixture thereof onto a second body and heating the separating agent to form a separating agent layer, attaching the first body to the second body such that the temporary adhesive layer faces the separating agent layer, heating the resulting product from a side of the first body to cure the temporary adhesive layer and the separating agent layer to accomplish a layered body, processing the layered body, and carrying out separation between the bodies and the temporary adhesive layer or the separating agent layer.

A fourteenth aspect of the present invention is the separation method according to the twelfth or thirteenth aspect, wherein the first body is a support, the second body is a wafer, and a circuit side of the wafer faces a surface of the first body.

A fifteenth aspect of the present invention is the separation method according to the twelfth or thirteenth aspect, wherein the first body is a wafer, the second body is a support, and a circuit side of the wafer faces a surface of the second body.

A sixteenth aspect of the present invention is the separation method according to any one of the twelfth to fifteenth aspects, wherein the processing is polishing of a rear surface.

Effects of the Invention

The temporary adhesive to be placed between a support and a circuit side of a wafer contains a component (A) that is cured by a hydrosilylation reaction; a polymerization inhibitor (B) having a 5% mass decrease temperature of 80° C. or higher as measured using a Tg-DTA; and a solvent (C).

The temporary adhesive of the present invention has excellent spin coating properties on the circuit side of the wafer, and contains a polymerization inhibitor of a specific component, thereby inhibiting curing from proceeding before attachment, and being capable of maintaining favorable attachment properties even after heating for removal of the solvent. Because a polysiloxane of a specific component is combined, the effect of having excellent heat resistance is achieved when the circuit side of the wafer or the support is attached to the adhesive layer or a rear surface of the wafer is processed. Furthermore, the temporary adhesive of the present invention allows the circuit side of the wafer to be easily separated after polishing of the rear surface of the wafer, and the temporary adhesive attached to the wafer or support can be readily removed after the separation.

In the processing of the side opposite to the circuit side of the wafer, the wafer is thinned by polishing. Subsequently, a through silicon via (TSV) or the like is formed on the wafer. Subsequently, the thinned wafer is separated from the support, and a layered body of the wafers is formed. Thus, three-dimensional mounting is carried out. Before or after this, an electrode or the like on the rear surface of the wafer is also formed. In the thinning of the wafer and the TSV process, the wafer is heated at 250 to 350° C. with the wafer attached to the support. However, the layered body as the temporary adhesive used in the present invention has heat resistance thereto.

The temporary adhesive is applied to the support or wafer. The temporary adhesive may contain a solvent to adjust the viscosity, depending on the blended component or the shape of the body to be coated (the support or wafer). The solvent to be used in the temporary adhesive is a hydrocarbon-based solvent with a high boiling point. The solvent is removed after the application and before curing of the temporary adhesive. Evaporation of the solvent in the applied adhesive starts at a temperature below the boiling point; however, this step requires the application of a temperature of, for example, about 80 to 130° C. (particularly about 110° C.). The polymerization inhibitor blended at that time may have a low volatilization temperature, depending on the component. If such a polymerization inhibitor with a low volatilization temperature is used, curing proceeds more than expected, because the hydrosilylation proceeds more due to the volatilization of the polymerization inhibitor in the blended composition. If curing of the adhesive applied on the support or wafer proceeds before the wafer is attached to the support, the adhesion between the support and the wafer decreases, which causes voids to form.

The present inventors focused on the finding that a polymerization inhibitor having a 5% mass decrease temperature of 80° C. or higher is effective in preventing the polymerization inhibitor from volatilizing during heating for removal of the solvent, thus accomplishing the present invention.

The present invention can provide a temporary adhesive that contains a polymerization inhibitor having high heat resistance, and thereby inhibits volatilization of the polymerization inhibitor, and allows a substrate to be processed while maintaining sufficient curing performance.

MODES FOR CARRYING OUT THE INVENTION

The present invention provides a temporary adhesive for separatably attaching a support to a circuit side of a wafer to process a rear surface of the wafer. The temporary adhesive comprises a component (A) that is cured by a hydrosilylation reaction; a polymerization inhibitor (B) having a 5% mass decrease temperature of 80° C. or higher as measured using a Tg-DTA; and a solvent (C).

In the present invention, the wafer is temporarily attached to the support with the adhesive, and the rear surface opposite to the circuit side of the wafer is processed by polishing, for example. Thus, the thickness of the wafer can be decreased.

The temporary attachment means that when the rear surface of the wafer is polished, the support is attached to the wafer, and the support can be separated from the thinned wafer after polishing the rear surface of the wafer.

Herein, separatable means that the separation strength is lower than that at another part to be separated, and separation is easy.

The component (A) comprises a polysiloxane (A1) including a polyorganosiloxane (a1) containing a polysiloxane selected from the group consisting of a siloxane unit (Q unit) of $SiO_2$, a siloxane unit (M unit) of $R^1R^2R^3SiO_{1/2}$, a siloxane unit (D unit) of $R^4R^5SiO_{2/2}$, and a siloxane unit (T unit) of $R^6SiO_{3/2}$ (with the proviso that $R^1$ to $R^6$ are each bonded to a silicon atom through an Si—C bond or an Si—H bond), wherein monovalent chemical groups of $R^1$ to $R^6$ each contain a $C_{1-10}$ alkyl group and a $C_{2-10}$ alkenyl group, and a polyorganosiloxane (a2) containing the polysiloxane, wherein monovalent chemical groups of $R^1$ to $R^6$ each contain a $C_{1-10}$ alkyl group and a hydrogen atom; and a platinum group metal-based catalyst (A2).

The polysiloxane (A1) contains the polyorganosiloxane (a1) and the polyorganosiloxane (a2). The polyorganosiloxane (a1) contains a $C_{1-10}$ alkyl group and a $C_{2-10}$ alkenyl group, and the polyorganosiloxane (a2) contains a $C_{1-10}$ alkyl group and a hydrogen atom. The alkenyl group and the Si—H group are subjected to a hydrosilylation reaction using the platinum group metal-based catalyst (A2) to form a crosslinking structure, resulting in curing.

The polyorganosiloxane (a1) is selected from the Q unit, the M unit, the D unit, and the T unit. For example, the polyorganosiloxane (a1) can be formed by a combination of (the Q unit and the M unit) and (the D unit and the M unit), a combination of (the T unit and the M unit) and (the D unit and the M unit), a combination of (the Q unit, the T unit, and the M unit) and (the T unit and the M unit), a combination of (the T unit and the M unit), or a combination of (the Q unit and the M unit).

The polyorganosiloxane (a2) is selected from the Q unit, the M unit, the D unit, and the T unit. For example, the polyorganosiloxane (a2) can be formed by a combination of (the M unit and the D unit), a combination of (the Q unit and the M unit), or a combination of (the Q unit, the T unit, and the M unit).

Examples of the $C_{2-10}$ alkenyl group include ethenyl group, 1-propenyl group, 2-propenyl group, 1-methyl-1-ethenyl group, 1-butenyl group, 2-butenyl group, 3-butenyl group, 2-methyl-1-propenyl group, 2-methyl-2-propenyl group, 1-ethylethenyl group, 1-methyl-1-propenyl group, 1-methyl-2-propenyl group, 1-pentenyl group, 2-pentenyl group, 3-pentenyl group, 4-pentenyl group, 1-n-propylethenyl group, 1-methyl-1-butenyl group, 1-methyl-2-butenyl group, 1-methyl-3-butenyl group, 2-ethyl-2-propenyl group, 2-methyl-1-butenyl group, 2-methyl-2-butenyl group, 2-methyl-3-butenyl group, 3-methyl-1-butenyl group, 3-methyl-2-butenyl group, 3-methyl-3-butenyl group, 1,1-dimethyl-2-propenyl group, 1-i-propylethenyl group, 1,2-dimethyl-1-propenyl group, 1,2-dimethyl-2-propenyl group, 1-hexenyl group, 2-hexenyl group, 3-hexenyl group, 4-hexenyl group, 5-hexenyl group, 1-methyl-1-pentenyl group, 1-methyl-2-pentenyl group, 1-methyl-3-pentenyl group, 1-methyl-4-pentenyl group, 1-n-butylethenyl group, 2-methyl-1-pentenyl group, 2-methyl-2-pentenyl group, 2-methyl-3-pentenyl group, 2-methyl-4-pentenyl group, 2-n-propyl-2-propenyl group, 3-methyl-1-pentenyl group, 3-methyl-2-pentenyl group, 3-methyl-3-pentenyl group, 3-methyl-4-pentenyl group, 3-ethyl-3-butenyl group, 4-methyl-1-pentenyl group, 4-methyl-2-pentenyl group, 4-methyl-3-pentenyl group, 4-methyl-4-pentenyl group, 1,1-dipentenylmethyl-2-butenyl group, 1,1-dimethyl-3-butenyl group, 1,2-dimethyl-1-butenyl group, 1,2-dimethyl-2-butenyl group, 1,2-dimethyl-3-butenyl group, 1-methyl-2-ethyl-2-propenyl group, 1-s-butylethenyl group, 1,3-dimethyl-1-butenyl group, 1,3-dimethyl-2-butenyl group, 1,3-dimethyl-3-butenyl group, 1-i-butylethenyl group, 2,2-dimethyl-3- butenyl group, 2,3-dimethyl-1-butenyl group, 2,3-dimethyl-2-butenyl group, 2,3-dimethyl-3-butenyl group, 2-i-propyl-2-propenyl group, 3,3-dimethyl-1-butenyl group, 1-ethyl-1-butenyl group, 1-ethyl-2-butenyl group, 1-ethyl-3-butenyl group, 1-n-propyl-1-propenyl group, 1-n-propyl-2-propenyl group, 2-ethyl-1-butenyl group, 2-ethyl-2-butenyl group, 2-ethyl-3-butenyl group, 1,1,2-trimethyl-2-propenyl group, 1-t-butylethenyl group, 1-methyl-1-ethyl-2-propenyl group, 1-ethyl-2-methyl-1-propenyl group, 1-ethyl-2-methyl-2-propenyl group, 1-i-propyl-1-propenyl group, and 1-i-propyl-2-propenyl group. In particular, ethenyl group, that is, vinyl group, or 2-propenyl group, that is, allyl group, can be preferably used.

Examples of the $C_{1-10}$ alkyl group include methyl group, ethyl group, n-propyl group, i-propyl group, n-butyl group, i-butyl group, s-butyl group, t-butyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, and 1-ethyl-2-methyl-n-propyl group. In particular, methyl group can be preferably used.

The polyorganosiloxane (a1) contains the $C_{1-10}$ alkyl group and the $C_{2-10}$ alkenyl group, wherein the $C_{1-10}$ alkyl group is methyl group, and the $C_{2-10}$ alkenyl group is ethenyl group, that is, vinyl group. In all the substituents of $R^1$ to $R^6$, the ratio of the alkenyl group may be 0.1 to 50.0% by mole, preferably 0.5 to 30.0% by mole, and the rest of $R^1$ to $R^6$ may be alkyl groups.

The polyorganosiloxane (a2) contains the $C_{1-10}$ alkyl group and a hydrogen atom, wherein the $C_{1-10}$ alkyl group is methyl group, and the hydrogen atom forms an Si—H structure. In all the substituents of $R^1$ to $R^6$, the ratio of the hydrogen atom, that is, an Si—H group, may be 0.1 to 50.0% by mole, preferably 10.0 to 40.0% by mole, and the rest of $R^1$ to $R^6$ may be alkyl groups.

The polyorganosiloxane (a1) and the polyorganosiloxane (a2) may contain the alkenyl group and the hydrogen atom represented by the Si—H group at a molar ratio in the range of 2.0:1.0, preferably 1.5:1.0.

The weight average molecular weight of each of the polyorganosiloxanes (a1) and (a2) to be used may fall in the range of 500 to 1,000,000 or 5,000 to 50,000.

The component (A) contains the platinum group metal-based catalyst (A2). A platinum-based metal catalyst is a catalyst for promoting a hydrosilylation addition reaction of the alkenyl group with the Si—H group. A platinum-based catalyst such as platinum black, platinum chloride, chloroplatinic acid, a reaction product of chloroplatinic acid with a monovalent alcohol, a complex of chloroplatinic acid with an olefin, or platinum bisacetoacetate is used. Examples of the complex of platinum with an olefin include a complex of divinyltetramethyldisiloxane with platinum. The amount of the platinum catalyst to be added may fall in the range of 1.0 to 50.0 ppm relative to the total amount of the polyorganosiloxanes (a1) and (a2).

In the present invention, an alkynyl alcohol may be further added as a polymerization inhibitor (retarder) (B) for inhibiting the hydrosilylation reaction from proceeding. The polymerization inhibitor preferably has a 5% mass decrease temperature of 80° C. or higher as measured using a Tg-DTA. The polymerization inhibitor can be represented by formula (1). In formula (1), $R^7$ and $R^8$ are each a $C_{6-40}$ aryl group, or a combination of a $C_{1-10}$ alkyl group and a $C_{6-40}$ aryl group, and $R^7$ and $R^8$ may together form a ring.

The polymerization inhibitor (B) may contain another polymerization inhibitor. When another polymerization inhibitor is contained, the polymerization inhibitor (B) content is preferably 25% by mass or more, in all the polymerization inhibitors. Examples of the other polymerization inhibitor include 1-ethynylcyclohexanol.

Examples of the polymerization inhibitor (B) include 1-phenyl-2-propyn-1-ol, 2-phenyl-3-butyn-2-ol, 1,1-diphenyl-2-propyn-1-ol, and 9-ethynyl-9-fluorenol.

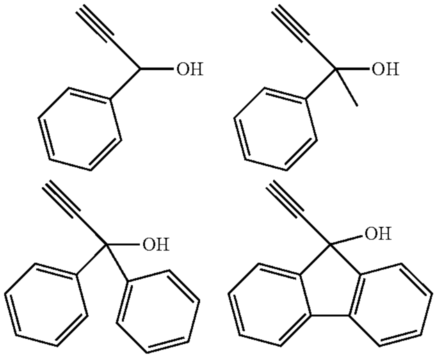

The polymerization inhibitor (B) may be added in an amount in the range from 1,000.0 to 10,000.0 ppm relative to the amount of the polyorganosiloxanes (a1) and (a2).

In the present invention, a solvent (C) may be added. An aliphatic hydrocarbon, an aromatic hydrocarbon, a ketone, or the like may be used. Examples of usable solvents include hexane, heptane, octane, nonane, decane, undecane, dodecane, isododecane, menthane, limonene, toluene, xylene, mesitylene, cumene, methyl isobutyl ketone (MIBK), butyl acetate, diisobutyl ketone, 2-octanone, 2-nonanone, and 5-nonanone. The solvent is used to adjust the viscosity, and may be used in an amount in the range from 1 to 40% by mass in the temporary adhesive.

The temporary adhesive of the present invention may contain a separating component (D). The separating component (D) may be, for example, a polydimethylsiloxane, an epoxy group-containing polydimethylsiloxane, a phenyl group-containing polydimethylsiloxane, or a mixture thereof.

The separating component (D) contains a siloxane unit (D unit) of $R^9R^{10}SiO_{2/2}$ (with the proviso that $R^9$ and $R^{10}$ are each bonded to a silicon atom through an Si—C bond), wherein $R^9$ and $R^{10}$ are each a $C_{1-10}$ alkyl group, an epoxy group-containing organic group, or a phenyl group-containing organic group.

The alkyl group is preferably methyl group, for example. The epoxy group is preferably 3-glycidoxypropyl or 2-(3,4-epoxycyclohexyl)ethyl. An epoxy-modified polydimethylsiloxane, for example, may be used. An epoxy-modified polydimethylsiloxane with an epoxy value of 0.1 to 5 may be used.

A combination of a phenylmethylsiloxane unit structure or a diphenylsiloxane unit structure with a dimethylsiloxane unit structure may also be used.

The polyorganosiloxane used in the separating component (D) contains a siloxane unit (D unit), and may also contain the Q unit, the M unit, and the T unit. For example, the polyorganosiloxane may contain only the D unit, a combination of the D unit and the Q unit, a combination of the D unit and the M unit, a combination of the D unit and the T unit, a combination of the D unit, the Q unit, and the M unit, a combination of the D unit, the M unit, and the T unit, or a combination of the D unit, the Q unit, the M unit, and the T unit.

The weight average molecular weight of the separating component (D) preferably falls in the range of 1,500 to 500,000, or 1,500 to 100,000.

In the adhesive of the present invention, the ratio of the component (A) to the component (D) may be any ratio.

In terms of adhesion, the ratio of the component (A) to the component (D) in the adhesive may be any ratio. It is desirable that the component (D) be contained in an amount of 0.005% by mass or more to further achieve a favorable separation property, while it is desirable that the component (D) be contained in an amount of 70% by mass or less to maintain mechanical physical properties of the adhesive. In the adhesive, the ratio in % by mass of the component (A) to the component (D) may be 99.995:0.005 to 30:70, and is preferably 99.9:0.1 to 75:25.

The present invention provides a layered body for processing a rear surface of a wafer, comprising a temporary adhesive layer formed using the temporary adhesive to separatably attach a support to a circuit side of the wafer. The layered body may contain the separating component (D) in the temporary adhesive.

As described above, a polydimethylsiloxane, an epoxy group-containing polydimethylsiloxane, a phenyl group-containing polydimethylsiloxane, or a mixture thereof may be used as the separating component (D).

Additionally, the present invention provides a layered body for processing a rear surface of a wafer, comprising a temporary adhesive layer that separatably attaches a support to a circuit side of the wafer, and a separating agent layer, wherein the temporary adhesive layer is formed using the above-described temporary adhesive, and the separating agent layer is formed of a polydimethylsiloxane, an epoxy group-containing polydimethylsiloxane, a phenyl group-containing polydimethylsiloxane, or a mixture thereof.

Still additionally, the present invention provides a method for attaching a layered body, comprising applying the above-described temporary adhesive onto a first body and removing the solvent by heating to form a temporary adhesive layer, attaching a second body to the temporary adhesive layer, and heating the resulting product from a side of the first body.

Yet additionally, the present invention provides a method for attaching a layered body, comprising applying the above-described temporary adhesive onto a first body and removing the solvent by heating to form a temporary adhesive layer, applying a separating agent including a polydimethylsiloxane, an epoxy group-containing polydimethylsiloxane, a phenyl group-containing polydimethylsiloxane, or a mixture thereof onto a second body and heating the separating agent to form a separating agent layer, attaching the first body to the second body such that the temporary adhesive layer faces the separating agent layer, and heating the resulting product from a side of the first body.

The method for attaching a layered body of the present invention includes a method wherein the first body is a support, the second body is a wafer, and a circuit side of the wafer faces a surface of the first body; and a method wherein the first body is a wafer, the second body is a support, and a circuit side of the wafer faces a surface of the second body.

The present invention provides a separation method comprising applying the above-described temporary adhesive onto a first body to form a temporary adhesive layer, attaching a second body to the temporary adhesive layer, heating the resulting product from a side of the first body to cure the temporary adhesive layer to accomplish a layered body, processing the layered body, and carrying out separation between the bodies and the temporary adhesive layer.

Additionally, the present invention provides a separation method comprising applying the above-described temporary adhesive onto a first body to form a temporary adhesive layer, applying a separating agent including a polydimethylsiloxane, an epoxy group-containing polydimethylsiloxane, a phenyl group-containing polydimethylsiloxane, or a mixture thereof onto a second body and heating the separating agent to form a separating agent layer, attaching the first body to the second body such that the temporary adhesive layer faces the separating agent layer, heating the resulting product from a side of the first body to cure the temporary adhesive layer and the separating agent layer to accomplish a layered body, processing the layered body, and carrying out separation between the bodies and the temporary adhesive layer or the separating agent layer. In the separation method, the processing is polishing of a rear surface.

In the separation method of the present invention, the first body is a support, the second body is a wafer, and a circuit side of the wafer faces a surface of the first body.

Alternatively, in the separation method of the present invention, the first body is a wafer, the second body is a support, and a circuit side of the wafer faces a surface of the second body.

Examples of the wafer include a silicon wafer having a diameter of 300 mm and a thickness of about 770 μm.

Examples of the support (carrier) include a glass wafer or a silicon wafer having a diameter of 300 mm and a thickness of about 700 mm.

For example, the adhesive layer may be formed by applying the adhesive onto the support with a spin coater, and the layered body may be formed by attaching the support to the circuit side of the wafer so that the adhesive is disposed therebetween, and curing the adhesive by heating at a temperature of 120 to 260° C.

Alternatively, the adhesive layer may be formed by applying the adhesive to the circuit side of the wafer with a spin coater, with the rear surface of the wafer facing downward, and removing the solvent by heating, and the layered body may be formed by attaching the support to the circuit side of the wafer so that the adhesive is disposed therebetween, and curing the adhesive by heating at a temperature of 120 to 260° C. The curing of the adhesive starts at a heating temperature of about 80 to 110° C. The heating temperature may be 260° C. or higher. From the viewpoint of the heat resistance of the circuit side (device side) of the wafer, the heating temperature is preferably 260° C. or lower. For example, the heating temperature may be about 110 to 220° C., particularly about 200° C. From the viewpoint of attachment of the wafer by curing, the heating time is preferably 1 minute or more. From the viewpoint of the stability of physical properties of the adhesive, the heating time is more preferably 5 minutes or more. For example, the heating time may be 1 to 180 minutes or 5 to 120 minutes. A heating device such as a hot plate or an oven may be used.

When the support and the wafer are joined under reduced pressure (for example, a reduced pressure of 10 to 10,000 Pa) so that the adhesive layer is disposed therebetween, the layered body can be formed. When the support and the wafer are joined, heating (for example, at 30 to 100° C.) may also be carried out under reduced pressure.

The thickness of the adhesive layer obtained by applying the adhesive may be 5 to 500 μm, 10 to 200 μm, 20 to 150 μm, 30 to 120 μm, or 30 to 70 μm.

In the processing of the side opposite to the circuit side of the wafer, the wafer is thinned by polishing, for example. Subsequently, a through silicon via (TSV) or the like is formed on the wafer. Subsequently, the thinned wafer is separated from the support and a layered body of the wafers is formed. Thus, three-dimensional mounting is carried out. Before or after this time, an electrode or the like on the rear surface of the wafer is also formed. In the thinning of the wafer and the TSV process, the wafer is heated at 250 to 350° C. with the wafer attached to the support. However, the layered body as the temporary adhesive used in the present invention has heat resistance thereto.

For example, a wafer having a diameter of 300 mm and a thickness of about 770 μm can be thinned to a thickness of about 80 to 4 μm, by polishing the rear surface opposite to the circuit side.

The wafer is attached to the support, the rear surface is processed (polished), and then the wafer is separated from the support. Examples of the method of separation include separation using a solvent, separation using a laser, mechanical separation using a machine having a sharp part, and separation by pulling the support and the wafer.

When the resin remains on the surface of the wafer, it can be removed by washing with a solvent (dissolution, lift-off), tape peeling, or the like.

The present invention provides a method for processing the layered body including achieving attachment by the above-described method, polishing the rear surface of the wafer, and then achieving separation by the above-described method.

EXAMPLES

Synthesis Example 1

Preparation of Component (A) for Adhesive 10.00 g of a base polymer formed of a vinyl group-containing MQ resin having a Mw of 6,900 (manufactured by Wacker Chemie AG) as a polysiloxane (a1), 3.90 g of a vinyl group-containing linear polydimethylsiloxane having a viscosity of 1,000 mPa·s (manufactured by Wacker Chemie AG) as a polysiloxane (a1), 1.168 g of an SiH group-containing linear polydimethylsiloxane having a viscosity of 70 mPa·s (manufactured by Wacker Chemie AG) as a polysiloxane (a2), 0.77 g of an SiH group-containing linear polydimethylsiloxane having a viscosity of 40 mPa·s (manufactured by Wacker Chemie AG) as a polysiloxane (a2), 0.042 g of 1,1-diphenyl-2-propyn-1-ol (manufactured by TCL) as an alkynyl alcohol polymerization inhibitor (B), and 3.90 g of 5-nonanone (manufactured by TCL) as a solvent (C) were stirred with a stirrer (THINKY MIXER manufactured by THINKY CORPORATION).

Separately, 0.1 g of a platinum catalyst (manufactured by Wacker Chemie AG) as (A2) and 5.0 g of a vinyl group-containing linear polydimethylsiloxane having a viscosity of 1,000 mPa·s (manufactured by Wacker Chemie AG) as a polysiloxane (a2) were stirred for 5 minutes with a stirrer (THINKY MIXER manufactured by THINKY CORPORATION) to obtain a mixture. 0.850 g of the mixture was added to the mixture obtained above, and the mixture was stirred for 5 minutes to obtain a component (A) for an adhesive (Sample 1).

Synthesis Example 2

Sample 2 was prepared as in Synthesis Example 1, except that 2-phenyl-3-butyn-2-ol (manufactured by ALDRICH) was used instead of 1,1-diphenyl-2-propyn-1-ol.

Synthesis Example 3

Sample 3 was prepared as in Synthesis Example 1, except that 1-ethynylcyclohexanol (manufactured by Wacker Chemie AG) was used instead of 1,1-diphenyl-2-propyn-1-ol.

Synthesis Example 4

60.80 g of a base polymer formed of a vinyl group-containing MQ resin having a Mw of 6,900 (manufactured by Wacker Chemie AG) as a polysiloxane (a1), 15.20 g of a vinyl group-containing linear polydimethylsiloxane having a viscosity of 1,000 mPa·s (manufactured by Wacker Chemie AG) as a polysiloxane (a1), 1.95 g of a vinyl group-containing linear polydimethylsiloxane having a viscosity of 200 mPa·s (manufactured by Wacker Chemie AG) as a polysiloxane (a1), 5.21 g of an SiH group-containing linear polydimethylsiloxane having a viscosity of 70 mPa·s (manufactured by Wacker Chemie AG) as a polysiloxane (a2), 3.26 g of an SiH group-containing linear polydimethylsiloxane having a viscosity of 40 mPa·s (manufactured by Wacker Chemie AG) as a polysiloxane (a2), 0.109 g of 1,1-diphenyl-2-propyn-1-ol (manufactured by TCL) as an alkynyl alcohol polymerization inhibitor (B), 0.217 g of 1-ethynylcyclohexanol (manufactured by Wacker Chemie AG), and 11.34 g of undecane (manufactured by WAKO) as a solvent (C) (C) were stirred with a stirrer (THINKY MIXER manufactured by THINKY CORPORATION).

Separately, 1.0 g of a platinum catalyst (manufactured by Wacker Chemie AG) as (A2) and 5.0 g of a vinyl group-containing linear polydimethylsiloxane having a viscosity of 1,000 mPa·s (manufactured by Wacker Chemie AG) as a polysiloxane (a2) were stirred for 5 minutes with a stirrer (THINKY MIXER manufactured by THINKY CORPORATION) to obtain a mixture. 0.521 g of the mixture was added to the mixture obtained above, and the mixture was stirred for 5 minutes to obtain a component (A) for an adhesive (Sample 4).

Synthesis Example 5

Sample 5 was prepared as in Synthesis Example 4, except that 0.043 g of 9-ethynyl-9-fluorenol (manufactured by TCL) was used instead of 0.109 g of 1,1-diphenyl-2-propyn-1-ol (manufactured by TCL).

(Measurement Conditions for Tg-DTA)

The 5% mass decrease temperature of a polymerization inhibitor was measured using TG-DTA200SR (manufactured by BRUKER), using the sample in an amount of about 5 mg, and using a heating rate of 10° C./min in air.

TABLE 1

| 5% Mass Decrease Temperature (° C.) of Polymerization Inhibitor | |
|---|---|
| Polymerization Inhibitor | 5% Mass Decrease Temperature of Polymerization Inhibitor |
| 1-Ethynylcyclohexyl | 71° C. |
| 1-Phenyl-2-propyn-1-ol | 90° C. |
| 2-Phenyl-3-butyn-2-ol | 99° C. |
| 1,1-Diphenyl-2-propyn-1-ol | 170° C. |
| 9-Ethynyl-9-fluorenol | 186° C. |

(Attachment Test)

A solution of 3.0 g of trade name SILRES 604 (manufactured by Wacker, component: polydimethylsiloxane) dissolved in a mixed solvent of 67.9 g of propylene glycol monomethyl ether and 29.1 g of propylene glycol monomethyl ether acetate was spin-coated at a thickness of 0.1 mm onto a 300-mm silicon wafer (thickness: 775 μm) and then cured at 200° C. for 1 minute to form a separating agent layer. On the 300-mm silicon wafer having the separating agent layer formed thereon, a film of an adhesive was formed by spin coating to give a thickness of about 50 μm. The adhesive film was heated at 110° C. for 1 minute to remove the solvent.

The silicon wafer having the adhesive layer was attached to a 300-mm glass wafer so that the adhesive was disposed therebetween, using XBS (attachment device manufactured by SUSS MicroTec AG). Thus, a layered body was produced.

Here, a layered body in which the attachment was achieved without voids was evaluated as (○), and a layered body in which the attachment was not achieved with the formation of voids was evaluated as (x).

TABLE 2

| Attachment Test | | |
|---|---|---|
| Example | Adhesive | Evaluation |
| Example 1 | Sample 1 | ○ |
| Example 2 | Sample 2 | ○ |
| Example 3 | Sample 4 | ○ |
| Example 4 | Sample 5 | ○ |
| Comparative Example 1 | Sample 3 | X |

In the absence of a polymerization inhibitor having a 5% mass decrease temperature of 80° C. or higher as measured using a Tg-DTA, the viscosity increased after heating for removal of the solvent, making the attachment difficult.

The adhesive according to the present invention is an adhesive used for permanent or temporary attachment. The adhesive that forms the adhesive layer contains a polyorganosiloxane component that is cured by a hydrosilylation reaction, a polymerization inhibitor having a 5% mass decrease temperature of 80° C. or higher as measured using a Tg-DTA, and a solvent. The inclusion of the solvent can improve the coating properties of the resin, and the inclusion of the polymerization inhibitor having a 5% mass decrease temperature of 80° C. or higher as measured using a Tg-DTA prevents a sharp increase in viscosity due to heating for removal of the solvent, and allows the subsequent attachment to be achieved without voids.

INDUSTRIAL APPLICABILITY

A temporary adhesive that forms a temporary adhesive layer between a support (supporting substrate) and a wafer contains a polyorganosiloxane component (A) that is cured by a hydrosilylation reaction; a polymerization inhibitor (B) having a 5% mass decrease temperature of 80° C. or higher as measured using a Tg-DTA; and a solvent (C). Because a polymerization inhibitor having high heat resistance is used, there is little volatilization of the polymerization inhibitor during heating for volatilization of the solvent in the temporary adhesive. As a result, unexpected curing of the temporary adhesive does not proceed, allowing the temporary attachment to be achieved without the formation of voids between the support and the wafer.

The invention claimed is:

1. A temporary adhesive for separatably attaching a support to a circuit side of a wafer to process a rear surface of the wafer, the temporary adhesive comprising a component (A) that is cured by a hydrosilylation reaction, wherein the component (A) comprises a polysiloxane (A1) including a polyorganosiloxane (a1) formed by a combination of siloxane units selected from the group consisting of a Q unit of SiO2, a M unit of $R^1R^2R^3SiO_{1/2}$, a D unit of $R^4R^5SiO_{2/2}$, and a T unit of $R^6SiO_{3/2}$, with the proviso that $R^1$ to $R^6$ each are a $C_{1-10}$ alkyl group or a $C_{2-10}$ alkenyl group bonded to a silicon atom and the polyorganosilxoane (a1) contains a $C_{1-10}$ alkyl group and a $C_{2-10}$ alkenyl group, and a polyorganosiloxane (a2) formed by a combination of siloxane units selected from the group consisting of a Q unit of $SiO_2$, a M unit of $R^1R^2R^3SiO_{1/2}$, a D unit of $R^4R^5SiO_{2/2}$, and a T unit of $R^6SiO_{3/2}$, wherein $R^1$ to $R^6$ each are a $C_{1-10}$ alkyl group or a hydrogen atom bonded to a silicon atom and the polyorganosiloxane (a2) contains a $C_{1-10}$ alkyl group and a hydrogen atom;

an epoxy group-containing polydimethylsiloxane, a phenyl group-containing polydimethylsiloxane, or a mixture thereof;

a polymerization inhibitor (B) having a 5% mass decrease temperature of 80° C. or higher as measured using a Tg-DTA; and a solvent (C).

2. The temporary adhesive according to claim 1, wherein the component (A) further comprises a platinum group metal-based catalyst (A2).

3. The temporary adhesive according to claim 1, wherein the polymerization inhibitor (B) is a compound of formula (1):

Formula (1)

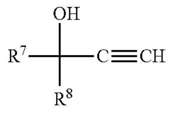

wherein $R^7$ and $R^8$ are each a $C_{6-40}$ aryl group, or a combination of a $C_{2-10}$ alkyl group and a $C_{6-40}$ aryl group, and $R^7$ and $R^8$ optionally form a ring together.

4. The temporary adhesive according to claim 1, wherein the polymerization inhibitor (B) is 1-phenyl-2-propyn-1-ol, 1,1-diphenyl-2-propyn-1-ol, or 9-ethynyl-9-fluorenol.

5. A layered body for processing a rear surface of a wafer, comprising a temporary adhesive layer formed using the temporary adhesive according to claim 1 to separatably attach a support to a circuit side of the wafer.

6. A layered body for processing a rear surface of a wafer, comprising a temporary adhesive layer that separatably attaches a support to a circuit side of the wafer, and a separating agent layer, wherein the temporary adhesive layer is formed using the temporary adhesive according to claim 1, and the separating agent layer is formed of a polydimethylsiloxane, an epoxy group-containing polydimethylsiloxane, a phenyl group-containing polydimethylsiloxane, or a mixture thereof.

7. A method for attaching a layered body, comprising applying the temporary adhesive according to claim 1 onto a first body and removing a solvent by heating to form a temporary adhesive layer, attaching a second body to the temporary adhesive layer, and heating the resulting product from a side of the first body.

8. A method for attaching a layered body, comprising applying the temporary adhesive according to claim 1 onto a first body and removing a solvent by heating to form a temporary adhesive layer, applying a separating agent including a polydimethylsiloxane, an epoxy group-containing polydimethylsiloxane, a phenyl group-containing polydimethylsiloxane, or a mixture thereof onto a second body and heating the separating agent to form a separating agent layer, attaching the first body to the second body such that the temporary adhesive layer faces the separating agent layer, and heating the resulting product from a side of the first body.

9. The method for attaching a layered body according to claim 7, wherein the first body is a support, the second body is a wafer, and a circuit side of the wafer faces a surface of the first body.

10. The method for attaching a layered body according to claim 7, wherein the first body is a wafer, the second body is a support, and a circuit side of the wafer faces a surface of the second body.

11. A separation method comprising applying the temporary adhesive according to claim 1 onto a first body to form a temporary adhesive layer, attaching a second body to the temporary adhesive layer, heating the resulting product from a side of the first body to cure the temporary adhesive layer to accomplish a layered body, processing the layered body, and carrying out separation between the bodies and the temporary adhesive layer.

12. A separation method comprising applying the temporary adhesive according to claim 1 onto a first body to form a temporary adhesive layer, applying a separating agent including a polydimethylsiloxane, an epoxy group-containing polydimethylsiloxane, a phenyl group-containing polydimethylsiloxane, or a mixture thereof onto a second body and heating the separating agent to form a separating agent layer, attaching the first body to the second body such that the temporary adhesive layer faces the separating agent layer, heating the resulting product from a side of the first body to cure the temporary adhesive layer and the separating agent layer to accomplish a layered body, processing the layered body, and carrying out separation between the bodies and the temporary adhesive layer or the separating agent layer.

13. The separation method according to claim 11, wherein the first body is a support, the second body is a wafer, and a circuit side of the wafer faces a surface of the first body.

14. The separation method according to claim 11, wherein the first body is a wafer, the second body is a support, and a circuit side of the wafer faces a surface of the second body.

15. The separation method according to claim 11, wherein the processing is polishing of a rear surface.

16. A temporary adhesive for separatably attaching a support to a circuit side of a wafer to process a rear surface of the wafer, the temporary adhesive comprising a component (A) that is cured by a hydrosilylation reaction, wherein the component (A) comprises a polysiloxane (A1) including a polyorganosiloxane (al) formed by a combination of siloxane units selected from the group consisting of a Q unit of $SiO_2$, a M unit of $R^1R^2R^3SiO_{1/2}$, a D unit of $R^4R^5SiO_{2/2}$, and a T unit of $R^6SiO_{3/2}$, with the proviso that $R^1$ to $R^6$ each are a $C_{1-10}$ alkyl group or a $C_{2-10}$ alkenyl group bonded to a silicon atom and the polyorganosilxoane (a1) contains a $C_{1-10}$ alkyl group and a $C_{2-10}$ alkenyl group, and a polyorganosiloxane (a2) formed by a combination of siloxane units selected from the group consisting of a Q unit of $SiO_2$, a M unit of $R^1R^2R^3SiO_{1/2}$, a D unit of $R^4R^5SiO_{2/2}$, and a T unit of $R^6SiO_{3/2}$, wherein $R^1$ to $R^6$ each are a $C_{1-10}$ alkyl group or a hydrogen atom bonded to a silicon atom and the polyorganosiloxane (a2) contains a $C_{1-10}$ alkyl group and a hydrogen atom;

a polymerization inhibitor (B) that is 1-phenyl-2-propyn-1-ol; and a solvent (C).

17. The temporary adhesive according to claim 1, wherein the polymerization inhibitor (B) comprises 1,1-diphenyl-2-propyn-1-ol.

* * * * *